(12) United States Patent
Wakayama et al.

(10) Patent No.: US 8,841,545 B2
(45) Date of Patent: Sep. 23, 2014

(54) SOLAR CELL WHEREIN SOLAR PHOTOVOLATIC THIN FILM IS DIRECTLY FORMED ON BASE

(75) Inventors: Yoshihide Wakayama, Shinjuku-ku (JP); Kazuki Moyama, Amagasaki (JP); Tadahiro Ohmi, Sendai (JP); Akinobu Teramoto, Sendai (JP)

(73) Assignees: Tohoku University, Sendai-Shi (JP); Tokyo Electron Limited, Tokyo (JP)

(*) Notice: Subject to any disclaimer, the term of this patent is extended or adjusted under 35 U.S.C. 154(b) by 140 days.

(21) Appl. No.: 12/735,692

(22) PCT Filed: Feb. 10, 2009

(86) PCT No.: PCT/JP2009/052197
§ 371 (c)(1),
(2), (4) Date: Aug. 9, 2010

(87) PCT Pub. No.: WO2009/101925
PCT Pub. Date: Aug. 20, 2009

(65) Prior Publication Data
US 2010/0326511 A1    Dec. 30, 2010

(30) Foreign Application Priority Data
Feb. 12, 2008  (JP) ................................. 2008-030707

(51) Int. Cl.
*H01L 31/00* (2006.01)
*H01L 31/0216* (2014.01)
*H01L 31/048* (2014.01)

(52) U.S. Cl.
CPC .............. *H01L 31/048* (2013.01); *Y02E 10/50* (2013.01); *H01L 31/02167* (2013.01); *Y02B 10/12* (2013.01)

USPC ............................................ 136/256; 136/259

(58) Field of Classification Search
CPC ................... H01L 31/02013; H01L 31/02167; H01L 31/022425; H01L 31/048; H01L 31/0481; H01L 31/0482
USPC .......................................... 136/256, 251, 259
See application file for complete search history.

(56) References Cited

U.S. PATENT DOCUMENTS 4,900,369 A * 2/1990 Hezel et al. .................... 136/255
5,589,403 A * 12/1996 Toyama et al. ................. 438/71
(Continued)

FOREIGN PATENT DOCUMENTS

CN      1218577 A    6/1999
JP      60-035579    2/1985
(Continued)

OTHER PUBLICATIONS

Contents of Korean Rejection of Korean Patent Application No. 10-2010-7017503, Dispatched on May 9, 2011, Korean Intellectual Property Office.
(Continued)

*Primary Examiner* — Eli Mekhlin
(74) *Attorney, Agent, or Firm* — Pearne & Gordon LLP

(57) ABSTRACT

Disclosed is a solar cell comprising a solar cell semiconductor thin film formed on a base, a transparent conductive film formed on the semiconductor thin film, and a nitride-containing moisture diffusion-preventing film which covers the upper surface of the transparent conductive film. The moisture diffusion-preventing film is preferably composed of at least a silicon nitride film or a silicon carbide nitride (SiCN) film.

5 Claims, 2 Drawing Sheets

(56) References Cited

U.S. PATENT DOCUMENTS

| | | | | |
|---|---|---|---|---|
| 6,111,189 | A * | 8/2000 | Garvison et al. | 136/244 |
| 6,399,873 | B1 * | 6/2002 | Sano et al. | 136/249 |
| 6,547,190 | B1 * | 4/2003 | Thompson et al. | 244/172.7 |
| 7,053,294 | B2 * | 5/2006 | Tuttle et al. | 136/265 |
| 2001/0054262 | A1 * | 12/2001 | Nath et al. | 52/173.3 |
| 2002/0011264 | A1 * | 1/2002 | Saito | 136/258 |
| 2005/0092359 | A1 * | 5/2005 | Uchida et al. | 136/256 |
| 2006/0096635 | A1 * | 5/2006 | Tuttle | 136/262 |
| 2007/0012352 | A1 * | 1/2007 | Wohlgemuth et al. | 136/251 |
| 2007/0131276 | A1 * | 6/2007 | Nee | 136/256 |

FOREIGN PATENT DOCUMENTS

| | | |
|---|---|---|
| JP | 60-050972 | 3/1985 |
| JP | 62-042467 | 2/1987 |
| JP | 62-264675 | 11/1987 |
| JP | 63-041082 | 2/1988 |
| JP | 07-263733 | 10/1995 |
| JP | 11-166304 | 6/1999 |
| JP | 2000-145074 | 5/2000 |
| JP | 2001-168363 | 6/2001 |
| JP | 2001513264 W * | 8/2001 |
| JP | 2001-267616 | 9/2001 |
| JP | 2002-004529 | 1/2002 |
| JP | 2002-151718 | 5/2002 |
| TW | 200737532 | 10/2007 |
| TW | M321146 | 10/2007 |

OTHER PUBLICATIONS

International Search Report of PCT/JP2009/052197 mailed on May 19, 2009 by ISA/Japan patent Office, Total 3 pgs.

* cited by examiner

SOLAR CELL WHEREIN SOLAR PHOTOVOLATIC THIN FILM IS DIRECTLY FORMED ON BASE

This application is a 35 U.S.C. sctn. 371 national phase application of International PCT Application Serial No. PCT/JP2009/052197 filed on Feb. 10, 2009, which claims the benefit of priority under 35 U.S.C. sctn. 119 from Japanese Patent Application No. 2008-030707 filed on Feb. 12, 2008, the entire contents of which are incorporated herein by reference.

FIELD OF THE INVENTION

The present invention relates to an inexpensive solar cell which can be installed on the surface of a building, a civil engineering structure or various kinds of transportation machines, such as vehicles and cars.

BACKGROUND OF THE INVENTION

Conventionally, thin film solar cells had problems in power generating efficiency, durability and cost. In addition, in case where a solar cell is installed on a building, generally, panel shaped solar cell units (including back side insulation material, a negative electrode, a power generation element, a transparent electrode and a surface protection layer) had been attached to an exterior section, such as a roof, with a stand set later on. In order to make the attachment of the solar cell with such a stand set unnecessary, various sorts of configurations in which a solar cell has been integrated onto a roof material with adhesives have been proposed.

For example, in Japanese Patent Application Publication No. H11-166304, (a patent document No. 1), a solar cell in which a steel plate configuring the roofing material and a solar cell have been integrated is described. The described roofing material is formed by a solar cell having a protective layers, such as a fluorine-resin film, an anti-reflection film for the sunlight to be easily absorbed and a PN-junction type multilayer structure that is configured with silicon or an amorphous silicon, an adhesive layer for attaching the solar cell onto the steel plate, a coating film for ensuring insulation when attaching the solar cell to the steel plate and a coating film for protecting and insulating the steel plate.

Japanese Patent Application Publication No. 2000-145074 (patent document No. 2) discloses a roof material in which a solar cell module having flexibility of being formed into a sheet-shape is integrated with a surface of a ceramic roof base material having a curved surface, for example, a calcinated tile that is composed of hydraulic property raw materials, such as cement and gypsum, and of inorganic materials by adhering with adhesives.

Further, Japanese Patent Application Publication No. 2002-4529 (patent document No. 30) discloses a solar cell module integrated to building-materials wherein the back surface of a solar cell panel is fixed onto a building-material panel with adhesives excluding end rim sections of both the back surface of the solar cell panel and the building-material panel.

Furthermore, Japanese Patent Application Publication No. 2002-151718 (patent document 4) discloses an example where a thin film solar cell is attached onto a negative electrode structured by silver or aluminum on a polyimide film attached onto a aluminum composite plate as a back sealing layer. In this case, there is no description of directly using aluminum of the aluminum composite board as a negative electrode. In addition, the fluorine resin film is used for the surface protective layer.

Furthermore, Japanese Patent Application Publication No. 2001-267616 (patent document 5) discloses a method of forming a solar cell integrated by utilizing a plating steel plate and a painted steel plate as a substrate, utilizing polyester resin or fluorine resin on the back side surface of the negative electrode, namely, on the surface of the steel plate as an insulation material and laminating the whole section with the fluorine resin film. Also in this example, a plating steel plate and a painted steel plate are not directly used as the negative electrode. Further, the fluorine resin film is used on the surface of the protective layer.

PROBLEMS TO BE SOLVED BY THE PRESENT INVENTION

In the prior arts described above, in the example (Japanese Patent Application Publication No. 2002-151718, patent document 4) in which the metal building materials including an aluminum plate and a steel plate is used as the substrate, the metal surface was not directly used as the negative electrode of the solar cell. Furthermore, conventionally, with respect to an insulation material (Japanese Patent Application Publication No. 2001-267616, patent document No. 5) like ceramics, a negative electrode is formed on the insulation material by intervening an insulation layer or a sealing layer made of a resin material, between the negative the electrode and the insulation material. However, there is no example in which the negative electrode of the solar cell has been directly formed on ceramics. In addition, there is a solar cell in which a thin film solar cell is not directly layered onto a solar cell, but panel-shaped solar cell units (an insulation material, the negative electrode, a power generation element, a transparent electrode and surface protection material) are separately made and attached to an exterior section. In this case, there is a drawback that an additional cost for the attachment will be needed. Conventionally, although when attempting to utilize a conductive substrate directly on the negative electrode, there is a problem that the existence of oxide on its surface makes an electric resistance between the substrate and the solar cell formed on the conductive substrate large and reduces the power generating efficiency.

On the other hand, as mentioned above, if a thin film solar cell is directly formed on the base of the roof material, a thin film solar cell and a base can be integrated. Therefore, unlike the case where a thin film solar cell unit is later attached onto the base of the roof material, the attachment cost becomes unnecessary. However, as described in the above-mentioned patent documents No. 1 to 5, the conventional integration is realized by attaching the solar cell unit manufactured in advance as a separate body onto the surface of base with adhesives. In such an integration, it is difficult to form a solar cell across the entire surface of the base to the maximum extent based, and it is also difficult to reduce the cost of the material cost. In addition, in forming the thin film solar cell on a base, a transparent electrode is shown in the most outside surface. However, this also has the problem that the transparent electrode is easily deteriorated with light or water. An object of the present invention is to solve the problems associated with power generating efficiency, durability and cost of such a thin film solar cell.

SUMMARY

A first aspect of the present invention is to provide a solar cell including a semiconductor thin film formed on a base, a transparent conductive film formed on the semiconductor thin film, and a nitride-containing moisture diffusion-preventing film, which covers at least an upper surface of the transparent conductive film.

A second aspect of the present invention is to provide the solar cell of the first aspect, wherein the moisture diffusion-preventing film is formed by an at least any one of silicon nitride film and a silicon carbide nitride film.

A third aspect of the present invention is to provide the solar cell as in any one of the first aspect, the second aspect and the third aspect, wherein the base is selected from the group consisting of iron, aluminum, zinc, copper, alloy thereof and a surface treatment product thereof, wherein an iron-alloy among said alloy includes carbon steel and stainless steel, wherein an iron-surface treatment product among said surface treatment product includes galvanized steel sheet and galvanium steel sheet, wherein an aluminum-alloy among said alloy includes duralumin and copper-aluminum alloy, wherein an aluminum-surface treatment product among said surface treatment product includes anodized aluminum, and wherein an copper-alloy among said alloy includes brass, silk floss and bronze.

A fourth aspect of the present invention is to provide the solar cell of the first aspect, wherein the base includes a non-conductive material and a conductive film formed on the non-conductive material, and wherein the non-conductive material is selected from the group consisting of plastics, paper, wood, stone, ceramics, glass, slate, composition-slate and calcium silicate.

A fifth aspect of the present invention is to provide the solar cell as in any one of the first aspect, the second aspect and the fourth aspect, wherein the conductive film is formed of metal, carbon or compound thereof provided by a method selected from the group of CVD, PVD, thermal spraying, coating and electroless plating.

A sixth aspect of the present invention is to provide the solar cell as in any of the first aspect, the second aspect, the third aspect, fourth aspect and fifth aspect, wherein a surface of the conductive film of the base is processed by ultrasonic cleaning and/or acid cleaning and by hydrogen plasma.

A seventh aspect of the present invention is to provide the solar cell of the first aspect, wherein the semiconductor thin film includes any one of silicon compound semiconductor and germanium, or composite material thereof.

A eighth aspect of the present invention is to provide the solar cell of the first aspect, wherein a main material of the transparent conductive film is zinc oxide, indium-tin oxide or tin oxide.

A ninth aspect of the present invention is to provide the solar cell of the first aspect, wherein the base is structured by a building material, which includes at least one of a roof material, a tile, a sizing material, a slate plate, an aluminum plate, a sheet steel and a resin film.

According to an embodiment of the present invention, it is possible to attain at least any one of improvement of generating efficiency and durability of a thin film solar cell, and cost reduction.

BRIEF DESCRIPTION OF THE INVENTION

DETAILED DESCRIPTION OF A PREFERRED EMBODIMENT

With respect to a solar cell of an embodiment of the present invention, a thin film solar cell is formed on a base itself. Thus, a problem of an increase in electrical resistance and a decrease in durability in an integrated solar cell can be solved. For example, in case when the solar cell of the embodiment of the present invention is applied to an architectural exterior material, the maximum light absorbing surface on the solar cell can be secured compared to a conventional integrated solar cell by installing a solar cell unit separately formed onto the base with adhesives. Further, the substrate, such as silicon substrate or glass substrate, for separately forming the solar cell becomes unnecessary. Thus, the cost of the material can be reduced.

In the solar cell of the embodiment of the present invention, a back side surface is the solar cell substrate itself. Therefore, for example, in case when ceramic is used for the substrate, an electrode being an element for forming the solar cell does not need to be protected by an organic material.

With respect to a light absorbing surface that receives the sunlight, a thin film element of the solar cell can be secured by forming a moisture diffusion-preventing film of a durable nitride on a surface of a transparent conductive film. For example, it is preferable to form this moisture diffusion-preventing film with at least one kind of silicon nitride film and silicon carbide nitride (SiCN) film.

For example, in case when a ceramic is used as the base in the solar cell of an embodiment of the present invention, the cost can be reduced compared to a case when a separately formed panel type solar cell is attached to the exterior material with adhesive or insertion afterwards.

The embodiment of the present invention will be described in reference to attached drawings hereafter.

Figure 1:
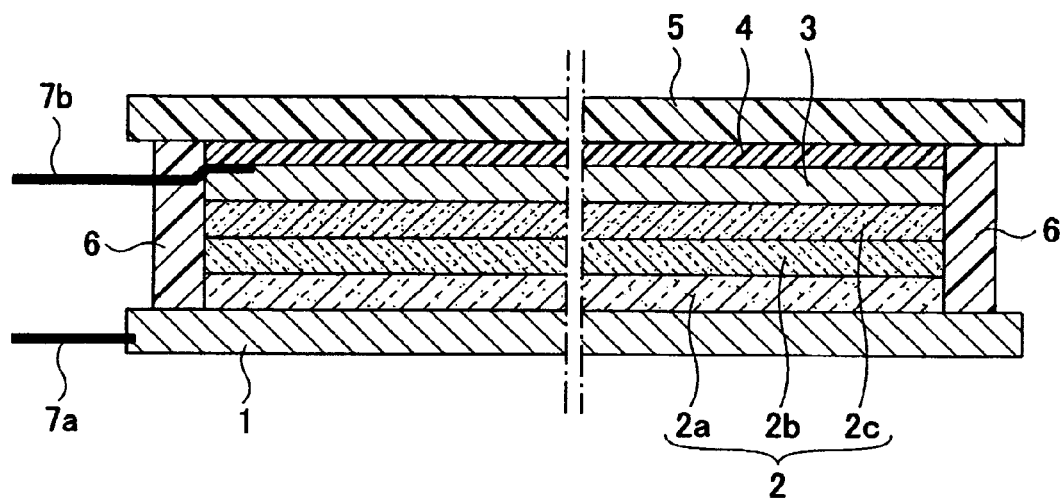
FIG. 1 illustrates a sectional view showing a solar cell of the first embodiment of the present invention.

FIG. 1 illustrates a sectional view of a solar cell of a first embodiment of the present invention. In FIG. 1, a symbol 1 denotes a base that configures the solar cell. This base 1 is conductive in this embodiment of the present invention. It is preferable that the entire base 1 is conductive. This conductive base 1 may be formed with iron, aluminum, zinc and copper, alloy of these metals or product whose surface has been treated with these metals. As an iron base alloy, carbon steel or stainless steel is preferred. The product whose surface has been treated with the iron base may include a galvanized steel plate or a galvanium steel plate. Further, as an aluminum base alloy, duralumin or a copper-aluminum alloy are preferred. A product whose surface has been treated with aluminum base may include anodized aluminum Furthermore, as a copper base alloy, brass, nickel silver and bronze are preferred.

For example, in case when aluminum or steel plate is used as the conductive base, there are many cases in which an oxide film forms on the surface and the conductivity is lost. According to the embodiment of the present invention, in order to utilize the material of these conductive bases as an electrode, oxide is removed from the surface. In addition to the removal of the oxide, a solar cell onto which a thin film solar cell is formed is provided. A process of removal of an oxide film from the surface is not limited to the above process. However, after performing an ultrasonic cleaning process and/or acid washing in the atmosphere, plasma is generated from high frequency while flowing hydrogen gas in a vacuum. The surface of the base is exposed to the plasma.

In this case, in order to prevent an oxidation deterioration, it is preferable to protect a back surface of the conductive base (an opposite side of a surface onto which the thin film solar cell has been layered) by performing a plating and a thermal spraying on to the back surface before a film forming process or by painting or attaching a film after completing the film forming process. Such a process performed on the back surface of the substrate can be utilized for other embodiments of the present invention.

A semiconductor thin film adopted by this embodiment of the present invention includes at least one or composite of silicon, compound semiconductor and germanium. A symbol 2 represents a semiconductor thin film in which a plurality of element thin films has been layered in order to configure a thin film solar cell on the surface of the base 1 being a substrate. A symbol 3 represents a transparent electrode film of an external surface side.

As described above, the semiconductor thin film 2 is configured by a plurality of element thin films. In this embodiment, the semiconductor thin film 2 is configured by three layers of n-type semiconductor thin film 2a, i-type semiconductor thin film 2b and p-type semiconductor thin film 2c in this sequence from the surface of the base 1. That is, the solar cell of this embodiment has a p-i-n junction structure generally adopted in an amorphous-silicon solar cell.

The semiconductor thin film 2 (2a, 2b, 2c) configured from the above plurality of layers can be formed by layering in the order of the n-type semiconductor thin film 2a, i-type semiconductor thin film 2b and p-type semiconductor thin film 2c from the surface of the base 1 utilizing a CVD (Chemical Vapor Deposition) method also used in forming a semiconductor thin film in an ordinary amorphous-silicon solar cell.

The transparent electrode film 3, which configures the solar cell with the semiconductor thin film 2, is formed in the same manner with the semiconductor thin film 2. Also the transparent electrode film 3 can be configured by utilizing a PVD (physical Vapor Deposition) method and being layered onto an external surface of the p-type semiconductor thin film 2c. A film formation temperature at this time is set below a heat-resistant temperature of the base 1 and below a temperature that does not cause an interdiffusion between the deposited transparent electrode film 3 and p-type semiconductor thin film 2c.

A moisture diffusion-preventing film 4 is layered on the external surface of the transparent electrode film 3. For example, the moisture diffusion-preventing film 4 can be layered and formed onto the external surface of the transparent electrode film 3 by utilizing the CVD method. Conventionally, in a method of forming the semiconductor thin film 2 and the transparent electrode film 3 on an electrode and generating the thin film solar cell, there has been a problem in which deterioration from light and moisture of the element thin film including the transparent electrode film 3. However, in this embodiment of the present invention, the deterioration of the element thin film can be prevented and its durability can be improved by providing the moisture diffusion-preventing film 4 on the light absorbing section of the transparent electrode film 3.

A transparent protection plate 5 being a plate-shaped transparent protection material (transparent protection layer) is attached to the external surface of the moisture diffusion-preventing film 4 by a sealing agent 6. The semiconductor thin film 2 (2a, 2b, 2c), the transparent electrode film 3 and the moisture diffusion-preventing film 4 are sealed by the transparent protection plate 5, the sealing agent 6 and the base 1. Thereby, the durability can further be improved. The sealing agent 6 used in attaching the transparent protection plate 5 can be formed by a silicone resin, urethane resin and epoxy resin.

Further, with respect to the base 1, it is preferable to use electrode material. In this case, an electrode material 7a for negative electrode is connected to the base 1, and an electrode material 7b for positive electrode is connected to the transparent electrode film 3 via the sealing agent. In order to satisfactorily connect the electrode material 7b and the transparent electrode film 3 being a transparent conductive film, the electrode material 7b can be attached to the transparent electrode film 3 by attaching a metal film to an end of the transparent electrode film 3 with vapor deposition and using a solder.

In this case, in case when a wire-reinforced glass of a conductive body is used as the transparent protection plate 5, the transparent protection plate 5 can function as a transparent protection layer material and also as a electrode material 7b.

On the other hand, in case when the material used for the base 1 is a flexible aluminum sheet or steel plate, a film-shaped transparent protection layer material 8, that is, a resin protection film can be used as the transparent protection layer material 5.

Figure 2:
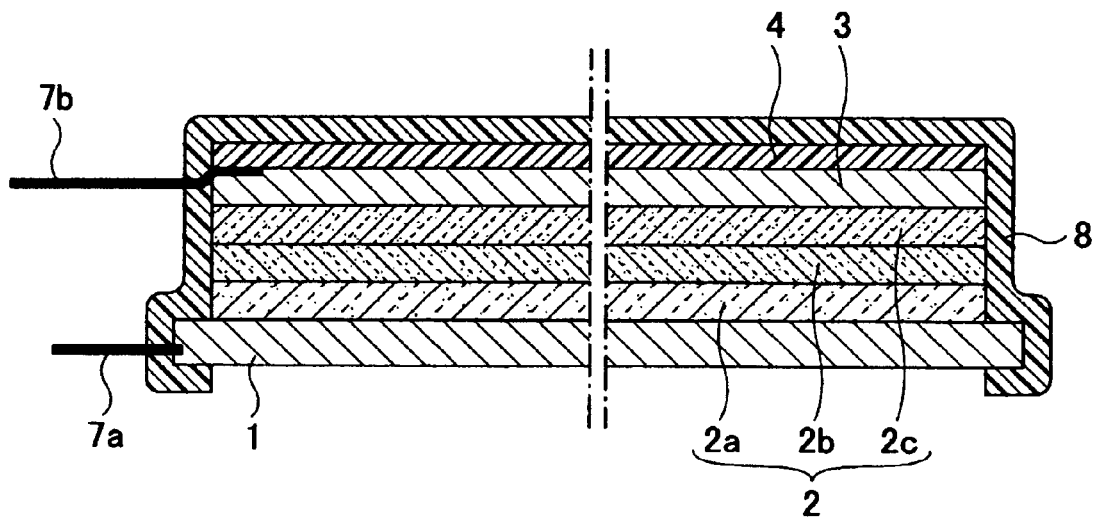
FIG. 2 illustrates a sectional view showing a solar cell of the second embodiment of the present invention.

That is, FIG. 2 illustrates a second embodiment of a solar cell related to the present invention. This second embodiment of the present invention is the same as that of the first embodiment of the present invention except the film-shaped transparent protection layer material 8, namely, a resin protection film, is used in place of the transparent protection plate 5 being the transparent protection layer material on the first embodiment of the present invention. Therefore, the same symbols are given to common configuration elements. Thus, the explanation for the element that overlaps with that of the first embodiment will be omitted. In a second embodiment of the present invention, as illustrated in the figure, a method of covering and layering the entire electrical power generation element with the resin protection film can be utilized.

For the polymer material that can be used for such a protection film, polyethylene terephthalate, polyethylene, ethylene (meta) acrylic acid copolymerization resin, ethylene acetic acid vinyl copolymerization resin or fluorine resin is preferred.

Figure 3:
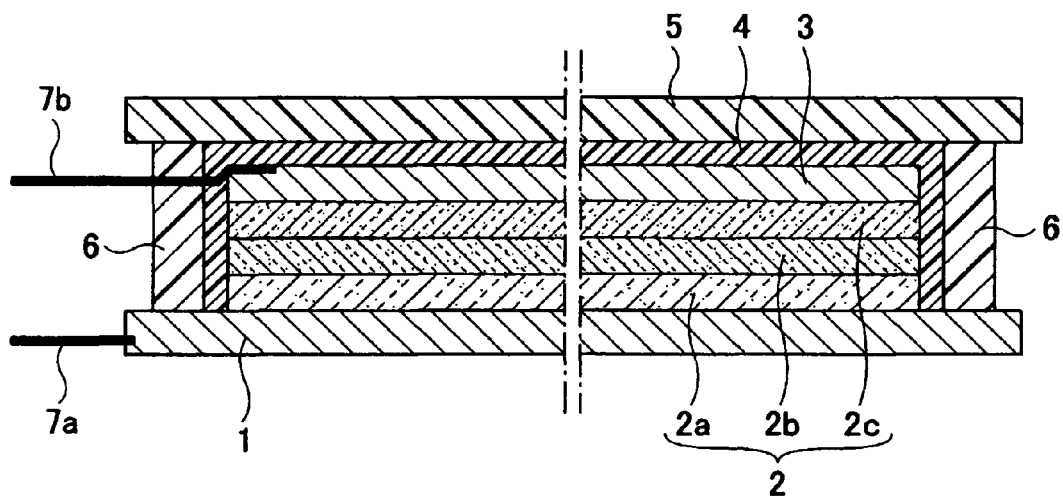
FIG. 3 illustrates a sectional view showing a solar cell of the third embodiment of the present invention.

Next, a solar cell related to a third embodiment of the present invention will be described in reference to FIG. 3. The solar cell of the third embodiment of the present invention differs from the solar cell (FIG. 1) of the first embodiment of the present invention in that the moisture diffusion-preventing film 4 of the third embodiment does not only cover the upper surface of the transparent electrode film 3 but also covers side surfaces of the transparent electrode film 3 and the semiconductor thin film 2. Other than that, the solar cell of the third embodiment is the same as that of the first embodiment of the present invention. Therefore, the same symbols are given to configuration elements that are the same in that of the first embodiment. Further, the explanation of the overlapping elements will be omitted.

In this third embodiment of the present invention, the moisture diffusion-preventing film 4 is disposed so that the moisture diffusion-preventing film 4 covers the side surfaces of the semiconductor thin film 2. Therefore, deterioration of the semiconductor thin film 2 can be further delayed and thus the durability can be improved. It is needless to say that the moisture diffusion-preventing film 4 that covers the side surfaces of the semiconductor thin film 2 can also be applied to the solar cell of the second embodiment and a fourth embodiment, which will be explained next.

Figure 4:
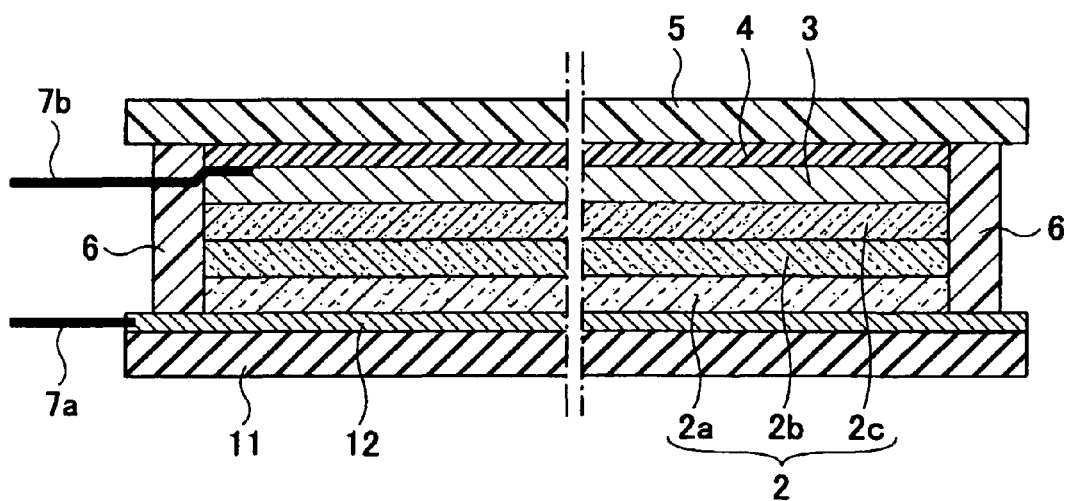
FIG. 4 illustrates a sectional view showing a solar cell of the fourth embodiment of the present invention.

Next, a solar cell of the fourth embodiment of the present invention will be described in reference to FIG. 4. In FIG. 4, a symbol 11 is a base that configures the solar cell in the same manner as the base 1 of the first embodiment. The base 11 differs from the base 1 and is nonconductive. This nonconductive base 11 may be produced from a proper material, such as concrete, ceramic, plastic, stone, wood, paper, glass, nonconductive ferrite, slate, compound slate or silicic acid calcium.

In case when the nonconductive base 11 is utilized, a conductive film is formed on its surface in advance. The conductive film, which is formed on the nonconductive base in advance, may be formed with the conductive material described as an example of the material for the base 1 of the solar cell in the first embodiment or the compound of those materials. This conductive film can be formed, for example, by utilizing either method of CVD, PVD, thermal spraying, painting or electroless plating. As a configuration of the above-mentioned compound, there are salt with the acid of the conductive material and an organic metallic compound.

In the fourth embodiment, a thin film solar cell is configured by, firstly, forming a conductive film 12 on a surface of the base 11. Then, the semiconductor thin film 2 (2a, 2b, 2c) is formed on a surface of the conductive film 12. Further, the transparent electrode film 3 is formed on the surface of the semiconductor thin film 2.

The moisture diffusion-preventing film 4 is layered on the external surface of the transparent electrode film 3. Further, on that surface, the transparent protection plate 5 is fixed and sealed on that surface by the sealing agent 6 the same as that of the first to third embodiments. The electrode material is connected to the conductive film 12 formed on the surface of the base 11. In this case, an electrode material 7a of the negative electrode is connected to the conductive film 12. Then an electrode material 7b of the positive electrode is connected to the transparent electrode film 3 through the sealing agent.

The semiconductor thin film 2 (2a, 2b, 2c), the transparent electrode film 3, the moisture diffusion-preventing film 4 and the transparent protection plate 5 in this fourth embodiment are the same as that of the first embodiment. Therefore, the same symbols are used for the corresponding elements and the descriptions that overlap will be omitted.

In the above described fourth embodiment of the present invention, for example, the conductive film 12 can be formed from conductive materials, such as metal, metal oxide, metal nitride and a conductive polymer, utilizing a method, such as CVD, PVD, thermal spraying, painting and electroless plating. A film formation temperature at this time is set at a heat-resistant temperature of the base 11 and below a temperature that does not cause an interdiffusion between the deposited transparent electrode film 3 and p-type semiconductor thin film 2c.

As described in the above-mentioned first through fourth embodiments of the present invention, a thin film solar cell is directly configured on a substrate, such as the base 1 or the base 11 on which the conductive film 12 is formed, and is integrated in this solar cell. By utilizing the solar cell of such a configuration, the solar cell can be configured on the surface of above-mentioned various kinds of architectures, such as a building, a civil engineering architecture, vehicles, airplanes, vessels or space satellites. In this case, the solar cell of the present invention can be configured as a flat plate shape or a curved plate shape corresponding to a place where the solar cell will be utilized. Also the solar cell can be used as a surface material of the structure with a complex surface shape by configuring and combining a solar cell of a predetermined dimension and shape.

As described above, the solar cell of an embodiment of the present invention is a solar cell, which is configured by a thin film solar cell by using the base 1 (or base 11) itself as a substrate. Therefore, as compared with the solar cell that is configured by attaching the separately configured solar cell onto a base using adhesive, it is possible to secure the maximum light absorbing section as a solar cell. The silicon substrate or glass substrate for configuring the solar cell of a separate body becomes simultaneously unnecessary, and the cost of the material can be reduced.

Next, the configuration of the solar cell and the embodiments 1-3 of the formation process of the present invention will be described below.

Embodiment 1

1. Base 1
Material: Aluminum plate, Thickness: approximately 5 mm (there is approximately 50 μm surface unevenness)
Process: A cleansing process after a sand blasting process Cleansing process: Physical washing by a roll brush
↓
Ultrasonic cleaning by an alkaline cleaning solution
(5 minutes)
↓
Ultrasonic cleaning by pure water
(3 minutes)
↓
Ultrasonic cleaning by ozone water
(5 minutes)
↓
Rinse with pure water Furthermore, the oxide film is removed by plasma as described below. Ar: 1SLM and H: 100 sccm are passed to one-step shower plate type microwave excitation high-density-plasma apparatus (refer to non-patent literature 1). By supplying 3 kW of microwave power, H radical is generated efficiently and H radical mainly removes the oxide of aluminum and surface moisture.

In addition, it is also possible to remove oxide of aluminum (Al) and surface moisture by passing Ar: 1 SLM from the upper row shower plate of two-step shower plate type microwave excitation high-density-plasma apparatus (non-patent literature 1), applying RF power (13.56 MHz) of approximately 100 volts onto the substrate (susceptor) as substrate bias and irradiating ion in plasma. At this time, other noble gas may be used instead of Ar. In addition, as long as the plasma that became independent around the substrate is not formed, the frequency and power of RF may be suitably selected. By performing the above-mentioned oxide film removal, the electric resistance between a semiconductor thin film and the negative electrode can be reduced, and electromotive force can be taken out effectively.

(Non-Patent Literature 1)
T. Ohmi, M. Hirayama, and A. Teramoto, "New era of silicon technologies-due-to radical reaction based semiconductor manufacturing, J. Phys. D: Appl. Phys., 39, R1-R17, January 2006.

2. N-Type Semiconductor Thin Film 2a

Material: P (phosphor) dope silicon thin film 1000 nm in thickness

Process: CVD (microwave 40 W/cm$^2$ pressure 100 mTorr ref. CVD system)

Quantity of gas flow: Ar 540 cc/min $SiH_4$ 1.5 cc/mm $PH_3$ 0.03 cc/min $H_2$ 10 cc/min 3. I-Type Semiconductor Thin Film 2b

Material: Silicon thin film thickness 2 μm

Process: CVD (microwave 40 W/cm$^2$ pressure 100 mTorr ref. CVD system)

Quantity of gas flow: Ar 540 cc/min $SiH_4$ 1.5 cc/mm $H_2$ 10 cc/min

4. P-Type Semiconductor Thin Film 2c

Material: B (boron) dope silicon thin film thickness 1000 nm

Process: CVD (microwave 40 W/cm$^2$ pressure 100 mTorr ref. CVD system)

Quantity of gas flow: Ar 540 cc/min $SiH_4$ 1.5 cc/mm $B_2H_6$ 0.03 cc/min $H_2$ 10 cc/min 5. Transparent Electrode Film 3

Material: ZnO Thickness 1 μm

Process: PVD and CVD (microwave 40 W/cm2) under the condition of 100 mTorr

Quantity of gas flow:

Ar 200 cc/min $O_2$ 20 cc/min

The organic metal containing Zn (any one of the following)

$Zn(MOPD)_2/C_{18}H_{30}O_6Zn$ $DIPZ/C_6H_{14}Zn$ $DMZn/Zn(CH_3)_2$ $DEZn/Zn(C_2H_5)_2$

6. Moisture Diffusion-Preventing Film 4

Material: The silicon nitride (SiN) thin film and/or silicon carbide nitride (SiCN) film, more precisely, a moisture diffusion-preventing film 4 is formed as follows.

Ar gas: 1SLM and $NH_3$ gas: 100 sccm is passed to the upper row shower plate of two-step shower plate type microwave excitation high-density-plasma apparatus (non-patent literature 1) and 3 kW of microwave power is supplied to excite plasma. Then, $SiH_4$: 20 sccm is passed to a lower-row shower plate to deposit 100 nm of SiN films. Then, $SiH_4$: 19 sccm and tetramethylsilane $(SiH(CH_3)_5)$:1 sccm are passed to deposit 100 nm of SiCN films. When repeating this above-described process for five times, 13.5 μm of SiN/SiCN is deposited and a moisture diffusion-preventing film is obtained with small stress. At this time, noble gas may be used instead of Ar. $N_2$ and $H_2$ mixed gas may be used instead of $NH_3$ gas. In addition, the stress created in SiN/SiCN can be reduced by adjusting the thickness of a SiN film, and the thickness of a SiCN film according to the characteristics of the base.

In this way, the moisture diffusion-preventing film 4 can cover the whole surface (light absorbing surface) of the transparent electrode film 3, and can improve durability. Furthermore, the durability as a solar cell can be further improved by depositing the moisture diffusion-preventing film 4 so that not only the light absorbing surface of the transparent electrode film 3 but also the side of the semiconductor thin film 2 may be covered as shown in the above-mentioned third embodiment.

7. Transparent Protective Plate 5

Material: Clear glass, Thickness 5 mm

Process: Adherent (the transparent protective plate 5 is attached by silicone resin as a sealing agent 6 so that the semiconductor thin film 2 (2a, 2b, 2c), the transparent electrode film 3, and the moisture diffusion-preventing film 4 may be sealed.)

8. Electrode Material 7B (Positive Electrode)

Material: Resin covered copper wire

Process: Soldering (the above-mentioned copper wire is connected to the transparent electrode film 3 with solder.)

9. Electrode Material 7a (Negative Electrode)

Material: Resin covered copper wire process: Soldering (the above-mentioned copper wire is connected to the base 1 (aluminum plate) with solder.)

In addition, acrylic lacquer is put to the back (opposite side of a solar cell layered side) of an aluminum substrate.

Embodiment 2

1. Base 1

Material: Steel plate Thickness 5 mm zinc/aluminum plating

Process: A cleansing process after zinc/aluminum plating process

Cleansing process: Physical cleansing by a roll brush

↓

Ultrasonic cleaning by an alkaline cleaning solution (5 minutes)

↓

Ultrasonic cleaning by pure water (3 minutes)

↓

Ultrasonic cleaning by ozone water (5 minutes)

↓

Rinse with pure water

2. N-Type Semiconductor Thin Film 2a

The same as Embodiment 1.

3. I-Type Semiconductor Thin Film 2b

The same as Embodiment 1.

4. P-Type Semiconductor Thin Film 2c

The same as Embodiment 1.

5. Transparent electrode film 3

Material: ITO thickness 1 μm

Process: PVD under 100 mTorr: Reactive sputtering of $Ar/O_2$ (noble gas/$O_2$) is performed by targeting ITO.

6. Moisture Diffusion-Preventing Film 4

The same as embodiment 1.

7. Transparent protective plate 5

Material: Transparent wired glass Thickness 3 mm

Process: Adherent (the transparent protective plate 5 is attached with urethane resin as a sealing agent 6 so that the semiconductor thin film 2 (2a, 2b, 2c), the transparent electrode film 3, and the moisture diffusion-preventing film 4 may be sealed).

8. Electrode Material 7b (Positive Electrode)

The same as Embodiment 1.

9. Electrode Material 7a (Negative Electrode)
The same as Embodiment 1.
10. Coating material may be put onto the back (opposite side of a solar cell layered side) of the steel plate board if needed.

Embodiment 3

1. Base 11
Material: Ceramic tile, Thickness, 15 mm (a metal conducting film is put onto the surface)
Process: Wash the surface of the base and form an aluminum film (metal conducting film 12) on the washed surface by a spraying process.
  Cleansing process: The same as Embodiment 1.
  2. N-Type Semiconductor Thin Film 2a
  The same as Embodiment 1.
  3. I-Type Semiconductor Thin Film 2b
  The same as Embodiment 1.
  4. P-Type Semiconductor Thin Film 2c
  The same as Embodiment 1.
  5. Transparent Electrode Film 3
  The same as Embodiment 1.
  6. Moisture Diffusion-Preventing Film 4
  The same as Embodiment 1.
  7. Transparent Protective Plate 5
  Material: Clear glass Thickness 7 mm
  Process: The same as Embodiment 1.
  8. Electrode Material 7b (Positive Electrode)
  The same as Embodiment 1.
  9. Electrode Material 7a (Negative Electrode)
  Material: Resin covered copper wire
  Process: Soldering (the above-mentioned copper wire is connected to the conductive film 12 formed on the surface of the base 11 with solder.)

In addition, the process temperature in CVD or PVD in the embodiments 1 to 3 described above is suitably set up, for example, in the range of 100° C.-400° C. in consideration of the heat-resisting property of the base 1 or 11.

The preferable embodiment and embodiments 1 to 3 for carrying out the above-explained invention explain the amorphous-silicon solar cell of a pin junction structure as a structure of a solar cell. However, the solar cell in the present invention can properly be applied to the solar cell using germanium and a compound semiconductor material as long as the base itself is configured as a substrate.

III-V group: GaAs, InP, AlGaAs
II-VI group: CdS, CdTe, and $Cu_2S$
I-III group: $CuInSe_2$, $CuInS_2$ The solar cell based on an embodiment of the present invention integrates the base and the thin film solar cell by configuring a thin film solar cell by using the base itself as a substrate. Therefore, as compared with the case where the separately configured solar cell is attached to the base with adhesives to integrate them, the maximum light absorbing section as a solar cell can be secured. At the same time, the substrate onto which the separately configured solar cell, for example, the silicon substrate or a glass substrate becomes unnecessary. Therefore, the cost of the material can be reduced.

In addition, the cost can be reduced as compared with the case where the separately configured panel-shaped solar cell units are attached to a solar cell later.

In addition, by forming the durable nitride moisture diffusion-preventing film of a silicon nitride film, and/or a silicon nitride carbide film for the surface (light absorbing surface) for receiving sunlight on the surface of a transparent conductive film, for example, it is possible to protect the element thin film of a solar cell and durability can be improved. Furthermore, the durability as a solar cell can be further improved by covering the side of not only the light absorbing surface of a transparent electrode film but also that of an element thin film with a moisture diffusion-preventing film.

In this way, the solar cell by an embodiment of the present invention can be integrated and can form a solar cell on the surface of almost all materials. Particularly, the solar cell of an embodiment of the present invention fits into the application to the building and the civil engineering structure. Furthermore, the solar cell of an embodiment of the present invention can be used as a solar cell configured on the surface of various kinds of transportation instruments, such as vehicles, airplanes, vessels and satellites, and can greatly contribute to energy saving.

What is claimed is:

1. A solar cell comprising:
   a semiconductor thin film formed directly on a surface of a substrate that is formed of a conductive material and is connected to an electrode material for one of a negative electrode and a positive electrode;
   a transparent conductive film that is formed on said semiconductor thin film and is connected to an electrode material for another one of the negative electrode and the positive electrode;
   a nitride-containing moisture diffusion-preventing film, which covers at least an upper surface and a side surface of said transparent conductive film and a side surface of said semiconductor thin film; and
   a conductive body, comprising a wire-reinforced glass, that is attached to an external surface of the nitride-containing moisture diffusion-preventing film,
   wherein the electrode material connected to the transparent conductive film penetrates a side surface of the nitride-containing moisture diffusion-preventing film to reach the transparent conductive film; and
   wherein the substrate is a structural surface of at least one of a building, a civil engineering architecture, a vehicle, an airplane, and a space satellite.

2. The solar cell of claim 1, wherein said moisture diffusion-preventing film is formed by at least one of silicon nitride film and a silicon carbide nitride film.

3. The solar cell of claim 1,
   wherein said substrate is selected from a group consisting of iron, aluminum, zinc, copper, alloy thereof and a surface treatment product thereof.

4. The solar cell of claim 1,
   wherein said semiconductor thin film includes any one of silicon, compound semiconductor and germanium, or composite material thereof.

5. The solar cell of claim 1,
   wherein a main material of said transparent conductive film is zinc oxide, indium-tin oxide or tin oxide.

* * * * *

UNITED STATES PATENT AND TRADEMARK OFFICE
CERTIFICATE OF CORRECTION

PATENT NO. : 8,841,545 B2  
APPLICATION NO. : 12/735692  
DATED : September 23, 2014  
INVENTOR(S) : Yoshihide Wakayama Page 1 of 1

It is certified that error appears in the above-identified patent and that said Letters Patent is hereby corrected as shown below:

In the Specification,

Column 1, line 56 please change "30" to -- 3 --

Signed and Sealed this
Twenty-fourth Day of March, 2015

Michelle K. Lee
*Director of the United States Patent and Trademark Office*